United States Patent [19]

Gross

[11] 3,983,624
[45] Oct. 5, 1976

[54] ELECTRICAL IGNITER AND METHOD OF MANUFACTURE

[75] Inventor: Fred E. Gross, Alexandria, Va.

[73] Assignee: The United States of America as represented by the Secretary of the Army, Washington, D.C.

[22] Filed: Jan. 10, 1952

[21] Appl. No.: 265,909

[52] U.S. Cl. .............................. 29/628; 102/28 R
[51] Int. Cl.² ......................................... H05K 13/00
[58] Field of Search.............. 102/28; 173/324.01; 29/155.55, 155.5H, 628

[56] References Cited
UNITED STATES PATENTS

| | | | |
|---|---|---|---|
| 1,605,688 | 11/1926 | Olin et al. | 102/28 |
| 1,606,413 | 11/1926 | Grant | 102/28 |
| 1,832,052 | 11/1931 | Schmitt et al. | 102/28 |
| 2,212,474 | 8/1940 | Johnson et al. | 102/28 |
| 2,265,419 | 12/1941 | Brand et al. | 65/158 |
| 2,279,451 | 4/1942 | English et al. | 102/28 |
| 2,338,409 | 1/1944 | Conradty | 29/155.55 |
| 2,575,071 | 11/1951 | Rockwell | 102/28 X |
| 2,632,237 | 3/1953 | Miller | 29/155.55 |

FOREIGN PATENTS OR APPLICATIONS 479,580   12/1951   Canada.......................... 29/155.55

OTHER PUBLICATIONS

"New Advances in Printed Circuits"–National Bureau of Standards, Miscellaneous Publication 192, (1948)–pp. 15,16,39,60 and 65.

Primary Examiner—Brooks H. Hunt
Attorney, Agent, or Firm—NathaN Edelberg

EXEMPLARY CLAIM

1. The method of joining a bridge wire to a pair of electrodes in a detonator in which the electrodes are separated by a dielectric, comprising the steps of aligning a plurality of detonators in a mounting jig, stringing bridge wire across the electrodes of said plurality of detonator assemblies, tensioning said wire until said wire and electrodes are in intimate contact, placing a droplet of conductive silver paint to the point of contact of said wire and said electrode, allowing said paint to harden at ambient temperature, and cutting said wire adjacent the outer periphery of said assembly to separate said detonators.

1 Claim, 5 Drawing Figures

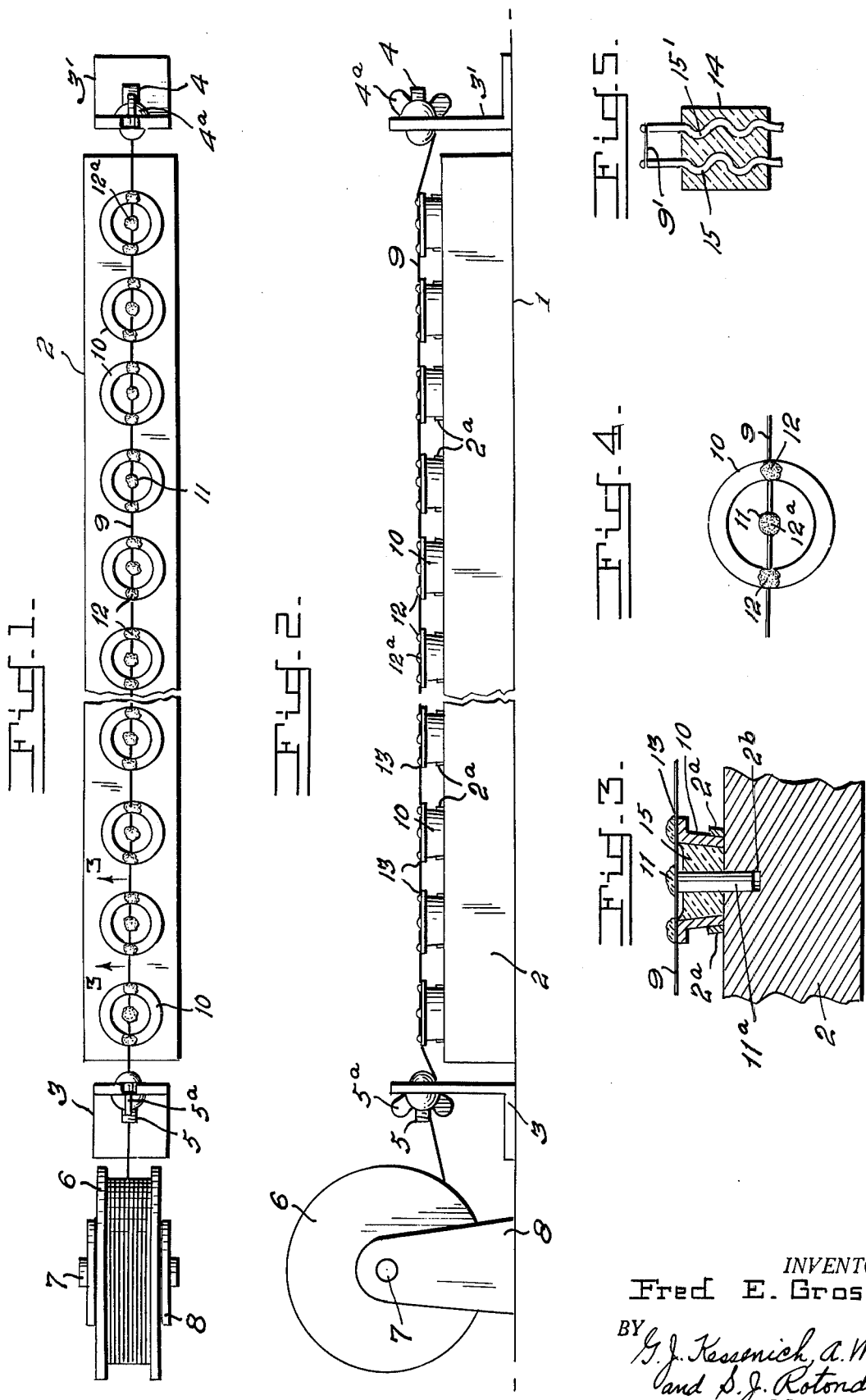

ELECTRICAL IGNITER AND METHOD OF MANUFACTURE

The present invention relates to an electrical igniter or detonator and a method of making the same.

Various forms of electrical detonators and igniters are used in ordnance work. Such devices may take the form of an external annular electrode insulated from a central contact by a dielectric substance, wherein a wire, which reaches a high temperature under the passage of an electrical current, is connected between the electrodes and the central contact. Or the detonator may consist of a pair of heavy wires embedded in a block of insulating material and similarly connected by a wire which reaches a high temperature when electricity is passed through it.

In prior art detonators of the type briefly described above, the high temperature, low resistance wire may be spot welded or soldered to the electrodes. Since the igniting wires are of small diameter, they are very easily damaged by the welding or soldering process. Consequently this process has led to the production of many defective igniters or detonators.

It is accordingly an object of this invention to provide a method for the manufacture of, and the production of an igniter, which eliminates the application of welding or soldering to effect a secure connection.

It is a further object of this invention to provide a method for connecting the low resistance wire to the electrodes in a way which is mechanically and electrically secure, so as to eliminate deficient igniters caused by welding or soldering.

It is also an object of this invention to provide an electrical igniter wherein the low resistance wire is connected to the electrodes by the application of conductive paint or ink, such as for example silver paint common in electronic circuits. The paint or ink may be permitted to harden at ambient temperatures or, by baking in an oven to effect connections which are free of the defects previously experienced, as when welding or soldering is resorted to.

When these and other objects in view which will become apparent as the following specification develops, reference is made to the accompanying drawing forming a part of the specification, and wherein:

FIG. 1 is a plan view of the apparatus used to manufacture the novel igniter.

FIG. 2 is a side elevation of the same apparatus.

FIG. 3 is a cross-section of a detonator cup and igniting wire taken on line 3—3 of FIG. 1.

FIG. 4 is a top elevation of a detonator in which a double bridge wire has been applied to the electrodes.

FIG. 5 is a modification of a single bridge wire similarly applied to the electrodes of a detonator.

Referring to the drawing, a base 1 supports a mounting jig 2, and L-shaped brackets 3, 3' mounted at opposed ends of the jig, so that the horizontal leg of the L in each case is directed outwardly. Affixed to bracket 3' is a locking device comprising a bolt 4 received in a horizontal hole in the upright leg of the L and which has a threaded end to accommodate a wing nut 4a. Similarly, bracket 3 is provided with bolt 5 and wing nut 5a so that a line drawn through the axes of the bolts will parallel, and be slightly above the top horizontal surface of mounting jig 2. At the end of jig 2 beyond bracket 3 is located a reel 6 rotatable about horizontal spindle 7 mounted on bracket 8. Stringing the bridging wire across the detonators is accomplished when wire 9 from reel 6 is fed through the locking devices mounted on brackets 3 and 3'. After the wire is fed through the hole in bracket 3' the bolt 4 is inserted in the hole and the wing nut 4a is tightened. Tensioning of the bridging wire is accomplished when reel 6 is rotated to pull the wire taut whereupon the locking device comprising bolt 5 and wing nut 5a is manipulated to lock the wire in place.

Before the wire is inserted into the apparatus, the detonating devices will have been put into place on the mounting jigs. These devices comprise an outer cup or downwardly tapering annular electrode 10 which tightly fits clips 2a on the mounting jig 2, dielectric material 15 which fills up the hollow in tapering electrode 10, and a central electrode or contact 11 embedded in the dielectric material and having a downwardly extending end 11a received in a hole 2b in the mounting jig to prevent the devices from moving about while they are being worked upon. A plurality of the detonating devices may be worked upon at the same time, and may be alined on the jig as clearly seen in FIGS. 1 and 2. The relative vertical positions of the wire and the tops of the detonating devices are such that the wire lies closely on the electrodes, and in a position to coincide with the diameters of the annular electrodes. Drops of conductive ink or paint, such as the silver paint used in printing electronic circuits, are placed at points of contact 12 and 12a between wire 9 and electrodes 10 and 11 respectively, and are allowed to harden to attain a firm bond between the igniting wire and the detonator electrodes. This hardening may be either at ambient temperature or in an oven. After the paint or ink has hardened, the detonating assemblies are separated by cutting the wire 9 adjacent the outer periphery of each assembly as at 13.

In the modification illustrated in FIG. 5, a block of dielectric material 14 has embedded in it wires 15 and 15' forming electrodes. A jig similar to the one shown in FIGS. 1 and 2, especially adapted to accommodate the unit, is used to secure to the electrodes an igniter wire 9' in a similar manner as described above.

Numerous other modifications and alterations of the structure which has been disclosed herein for purposes of illustrations will be apparent to one skilled in the art, and it is obvious that the same may be made without departing from the spirit and scope of the invention as defined in the following claims.

I claim:

1. The method of joining a bridge wire to a pair of electrodes in a detonator in which the electrodes are separated by a dielectric, comprising the steps of aligning a plurality of detonators in a mounting jig, stringing bridge wire across the electrodes of said plurality of detonator assemblies tensioning said wire until said wire and electrodes are in intimate contact, placing a droplet of conductive silver paint to the point of contact of said wire and said electrode, allowing said paint to harden to ambient temperature, and cutting said wire adjacent the outer periphery of said assembly to separate said detonators.

* * * * *